United States Patent [19]

Hojaji et al.

[11] Patent Number: 5,270,292
[45] Date of Patent: Dec. 14, 1993

[54] METHOD FOR THE FORMATION OF HIGH TEMPERATURE SEMICONDUCTORS

[75] Inventors: Hamid Hojaji, Bethesda; Aaron Barkatt, Silver Spring, both of Md.

[73] Assignee: The Catholic University of America, Washington, D.C.

[21] Appl. No.: 659,719

[22] Filed: Feb. 25, 1991

[51] Int. Cl.$^5$ .................... H01B 12/06; H01L 39/12
[52] U.S. Cl. ........................................ 505/1; 505/733; 505/739; 264/66
[58] Field of Search .................. 505/1, 780, 779, 733, 505/739; 252/521; 501/152; 264/66

[56] References Cited

U.S. PATENT DOCUMENTS

| | | | |
|---|---|---|---|
| 4,994,437 | 2/1991 | Torii et al. | 505/733 |
| 5,011,823 | 4/1991 | Jin et al. | 505/733 |

FOREIGN PATENT DOCUMENTS 374263   6/1990   European Pat. Off. .
01-242414  9/1989   Japan .

*Primary Examiner*—Mark L. Bell
*Assistant Examiner*—C. M. Bonner
*Attorney, Agent, or Firm*—Cushman, Darby & Cushman

[57] ABSTRACT

Improved superconducting materials with high maximum magnetization, remanent magnetization and diamagnetic susceptibility can be made by enriching the base Y-Ba-Cu-O composition, Y:Ba:Cu=1:2:3, with respect to Y, or adding other trivalent or pentavalent elements (e.g. rare earths, Nb) to this composition. The mixed oxide materials are heated to melt a substantial fraction of their weight, quenched to a low temperature, re-heated to a temperature lower than the one initially used to effect melting, and annealed by slow cooling under air or oxygen.

14 Claims, No Drawings

METHOD FOR THE FORMATION OF HIGH TEMPERATURE SEMICONDUCTORS

FIELD OF THE INVENTION

The present invention relates to high temperature bulk superconducting materials and methods for their formation. The high temperature superconducting materials of the present invention possess improved magnetic and electrical properties.

BACKGROUND OF THE INVENTION

High-temperature superconducting materials based on the $Y_1Ba_2Cu_3O_z$ or 123 formulation (z having a value substantially higher than 6 but lower than 7) have been known to have a superconducting transition temperature ($T^*$) of approximately 90° K. (Wu et al, Physical Review Letters, Vol. 58, pp. 908–910, 1987).

In addition to a high $T_c$, it is desirable for a superconducting material to have a high diamagnetic susceptibility (x), high magnetization at low magnetic fields ($M_{max}$) and high remanent magnetic hysteresis at higher magnetic fields (delta M). Such properties make a material suitable for applications involving levitation based on the Meissner effects, such as the production of frictionless bearings. Furthermore, such properties are indicative of a high critical current ($J_c$), which is important for electronic applications.

It is known that the method of preparation of bulk superconducting materials has a significant effect on the properties of these materials. For example, materials prepared by sintering mixed oxide powders of the stoichiometric 123 composition below or around its incongruent melting point, i.e. below about 1000° C., are known to provide low values of x, $M_{max}$ and delta M. This is especially true for bulk materials, as distinguished from wires or films.

In the production of high Tc Y-Ba-Cu-O superconductors, the ratio Y:Ba:Cu of 1:2:3 has been considered optimum in order to provide single crystal superconductors and thin film semiconductors with the best properties. In general, deviations from this ratio, as well as the substitution of other rare earths for yttrium, do not improve the magnetic and electrical properties of the superconductors, and in fact generally tend to diminish the magnetic and electrical properties of the superconductor.

It has been unexpectedly found in the present invention that when 123 based superconducting materials are prepared by heating the mixed oxides in a one or two step melt process, a substantial enrichment of the 123 composition with respect to yttrium content or addition of further Group III or Group V metal can result in significantly improved magnetic and electric properties.

SUMMARY OF THE INVENTION

The present invention relates to novel superconductors of the Y-Ba-Cu-O type which possess a stoichiometric ratio outside the traditional 1:2:3 range, or which contain additional elements as a supplement to yttrium. Superconducting compositions of this type possess improved magnetic and electrical properties.

Another aspect of the present invention is a method for the preparation of high $T_c$ superconductors. One embodiment of this method is a two step melt quench process. This involves heating a mixture of oxides to a temperature above 1200° C., rapidly cooling the mixture to below 900° C., reheating the mixture to a temperature above 1000° C. which is cooler than the initial temperature used for the partial melting process, and slowly cooling down the mixture to below 800° C. and then cooling the mixture to room temperature.

Another aspect of the present inventer is a method for the preparation of a $YBa_2Cu_3O_z$ superconductor through a single step melt quench process where the specimens were heated to a temperature above 1000° C. and then quenched. It was surprisingly found that when compounds formed by this method were enriched with Yttrium so as to make the Y:Ba:Cu ratio x:2:3, improved properties were obtained. (Hojaji et. al. J. Mat. Res., vol 5, no. 4, April 1990). The yttrium enhanced materials were the first of the materials of the present invention to be developed.

DETAILED DESCRIPTION OF THE INVENTION

The present invention is directed towards imposed bulk high-$T_c$ superconductors and methods for producing high-$T_c$ superconducting ceramics with improved magnetic and electric properties.

The starting materials used in the present invention are made by preparing a mixture of oxides, oxide precursors or both, of yttrium, barium, copper and a Group III or Group V metal. Oxide precursors may include carbonates, hydroxides, oxalates, nitrates or any other salts or compounds of the metals listed above which can be converted to the corresponding oxides by heating. The mixture in accordance with one aspect of the invention is prepared by mixing together powders of the various oxides or oxide precursors. Other methods of preparing the mixture which have been described in the literature include chemical precipitation of hydroxides, oxalates or other insoluble compounds, freeze-drying of combined solutions of salts of the various metal ions, and decomposition of organometallic compounds of these metal ions. According to one preferred embodiment the mixed powders are calcined several times at temperatures below 950° C., and they are cooled and re-ground between successive calcinations. This forms the starting material for the present process.

The compositions of the present invention can be described by the general formula $M_1A_yB_tCu_3O_z$. In this formulation the Cu content is set arbitrarily to 3, and the number of moles of the additive A and the component B are given by y and t, respectively. The use of the formula above only designates an overall composition and does not imply the presence of a chemical compound corresponding to this composition.

Suitable elements for component M of the present invention are one or more elements selected from the group consisting of Y, La, and Ln. M can either be a single element alone, or a mixture of elements. A preferred element for use as M in the present invention is Y.

Elements which are suitable for use as component A in the present invention include one or more elements selected from the group consisting of Sc, Y, La, Ln, V, Nb, Ta, Al, Ga, In, Tl and Bi, and Mo. Component A may be either a single one of these elements or a mixture of one or more of these elements. Preferred elements for use as component A in the present invention are one or more elements selected from the group consisting of Sc, Y, La, Ln, Nb, Ta and In.

Elements which are suitable for use as component B in the present invention include one or more compounds selected from the group consisting of Ba and Sr.

These elements may be used alone or may be used in a mixture. A preferred element for use as component B is Ba.

The value of y in the present invention should be in the range 0.001 to 1.0, preferably in the range 0.01 to 0.1, more preferably in the range 0.01 to 0.5. The value for t should be in the range 1.8 to 2.2, preferably in the range 1.95 to 2.05. The most preferred value for t is 2.0. The value of Z should be in the range substantially higher than 6 but lower than 7.

Ln, as used above, represents any of the lanthanides of atomic numbers between 58 (Ce) and 71 (Lu). When M is yttrium and excess yttrium is selected as the additive, the total yttrium content in the formula above is given by 1+y. The same is true for other types of M. The symbols A and B can each represent a combination of several elements, for instance A may be a mixture of Y, Sm and Ho and B may be a combination of Ba and Sr.

After preparation of the mixed oxide or oxide precursor powder, the ceramic is formed. In the first embodiment of the present invention, the mixture is formed into an appropriate shape by the conventional ceramic forming techniques such as pressing or molding, and then placed on an appropriate support, preferably, a refractory substrate, such as alumina or magnesia. The mixture is heated to a temperature above about 1000° C., preferably between 1000° C. to about 1350° C. and most preferably between 1050° and about 1250° C., causing a portion of the mixed oxides to be melted. The soak time at the peak firing temperature can be up to several days, depending on the temperature and starting composition. Preferable the soak time is from 5 minutes to about 24 hours, and most preferably from 5 minutes to about less than 10 hours. The liquid phase of the partially melted material is quite corrosive, and reacts with most refractory substrates including platinum. Therefore it is desirable to limit the soak time at high temperature to short durations, as specified above.

The partially melted material is then cooled down at a slow rate to a temperature below 1000° C. This cooling is achieved using a cooling rate of about 0.5° C. to 30° C. per hour. A preferred cooling rate is between about 10° to 1° C./hr, and a most preferred cooling rate is between about 1° to 5° C./hr. Cooling below about 1000° C. to room temperature is carried out at a cooling rate of 1° C./hr to 120° C./hr, preferably between about 2° C./hr to 60° C./hr, and most preferably from 2° C./hr to 20° C./hr. An intermediate isothermal treatment at a temperature between about 600° C. to about 400° C. may be carried out to ensure complete oxygenation. The isothermal treatment time is dependent on the specimen size and can vary from about several hours to several days. Cooling is carried out under a static or flowing oxygen containing atmosphere such as oxygen gas or air.

A second embodiment of the present invention involves subjecting the mixed oxide or oxide precursor starting materials to a two step process. This process involves heating the mixed oxides to a temperature above about 1200° C., preferably between 1350° C. and about 1600° C. and most preferably between 1400° and 1500° C. and then rapidly quenching the mixture to a temperature below about 900° C., preferably below 700° C., most preferably below 300° C. In accordance with the invention, heating is carried out in crucibles made out of platinum, a platinum alloy, iridium or another refractory metal, alloy or ceramic material. In accordance with a preferred embodiment of the invention, quenching occurs by rapid cooling, performed by pouring the material into a metallic mold such as a brass mold. This permits preparation of products with a desired shape. The mold may be cooled using forced air cooling.

The quenched material is then re-heated to a temperature above 1000° C., preferably between about 1050° C. and about 1300° C., most preferably between about 1100° C. and about 1250° C. The soak time at the peak firing temperature is identical to the time ranges specified in the first embodiment and the same considerations of liquid phase corrosivity are taken into account, since the liquid phases in the partially melted material in the first embodiment, and after the re-heating step in the second embodiment, are almost identical. The second heating may be carried out on a support made out of a refractory metal such as platinum or a platinum alloy. In a preferred embodiment of the invention, a support made out of a ceramic material such as alumina or magnesia coated with pre-fired mixed Y-Ba-Cu oxide powder is used in order to minimize the extent of reaction between the quenched material and the support. The material is cooled down in a final cooling step at a cooling rate of 0.5° C./hr to about 300° C./hr, preferably between 1° C./hr to about 60° C./hr, most preferably between 1° C./hr to about 30° C./hr. Cooling is carried out under a static or flowing oxygen-containing atmosphere; such as oxygen gas or air.

The superconducting compositions made using the processes of the present invention exhibit high diamagnetic susceptibilities as well as high magnetization at low magnetic fields, a large fraction of which is retained at high fields. It is believed, without limiting the scope of the invention to the case where the following explanation is valid, that in the first embodiment heating the material above 1000° C. converts the material to a mixture of solid $Y_2BaCuO_5$ (211 phase) and a liquid phase. Slow cooling from the peak partial melting temperature to below 1000° C., converts the 211 phase to $YBa_2Cu_3O_z$ (123 phase) which will form a layered structure. In the second embodiment, the heating of the material to a temperature above 1200° C. largely converts the material to a mixture of solid $Y_2O_3$ and a liquid phase. Upon rapid cooling this mixture gives rise to a structure dominated by the $Y_2BaCuO_5$ phase. The second heat treatment followed by slow cooling below 1000° C. converts $Y_2BaCuO_5$ to $YBa_2Cu_3O_z$, which assumes the orthorhombic superconducting form during continued slow cooling in the presence of oxygen. It is believed, without limiting the scope of the invention, that the 211 phase in products made using the two step process is smaller and is more uniformly dispersed than in products made using the one step process. It is further believed that the size and the population density of the second phase can effect the flux pinning characteristics of the final superconducting material. The presence of excess yttrium or a Group III or Group V additive during this process can lead to the retention of a minor amount of the 211 phase, with possible substitution of additive for the yttrium in the final material. This can enhance the magnetic properties by the elimination of the $BaCuO_2$ insulating phase which is usually present at the grain boundaries of the stoichiometric (y=0) material, and through elimination of cracks and grain separations which are due to large thermal stresses in the y=0 materials, and more importantly through giving rise to sites in the structure which produce magnetic flux pinning of the final product.

Structures of the compositions of the present invention were examined by X-ray diffraction, scanning electron microscopy, and energy dispersive X-ray analysis in order determine the structure of the final product. The materials which were produced by these methods were determined to be substantially 123 crystals with small 211 crystals at the grain interfaces. The number of observed cracks and imperfections in the grain bodies were reduced in the compositions of the present invention, as compared to previous products.

The preparation and characteristics of the materials produced in accordance with invention are illustrated by the following non-limiting Examples.

EXAMPLES 1-4

Commercial Analytical Reagent Grade powders of $Y_2O_3$. $BaCo_3$ and $CuO$ powders were thoroughly mixed by ball milling in acetone using zirconia grinding media and then dried. The total batch size in each case was approximately 100 g, and the atomic Y:Ba:Cu ratios were $(1+x):2:3$ where x was varied between 0.0 and 0.5. After mixing and drying, the mixtures were calcined at atmospheric pressure under flowing oxygen at 890° C. over a period of 17 hours and slowly cooled. Upon removal from the furnace, the powders were ground in a mortar and pestle, re-fired under flowing oxygen at 900° C. for 20 hours and slowly cooled. They were then ground to a very fine particle size.

After calcination, the powders were melted in platinum crucibles in air by introducing them into a furnace at a temperature of about 1400° C. and leaving them at this temperature for 30 minutes. The melts were quenched in brass molds under forced-air cooling. The quenched materials were then rapidly heated at a rate of 25° C./min to a temperature of 1050° C. in a platinum dish, left at this temperature for 20 minutes, cooled at a rate of 8° C./min to 960° C., left for 6 hours, cooled at 10° C./hr to 930° C., at 60° C./hr to 650° C., left at that temperature for 6 hours, cooled at 10° C./hr to 550° C. and finally cooled at 60° C./hr to room temperature. The resulting material at $x=0.1$ was observed by scanning electron microscopy to have a layered grain structure which was better aligned and closely packed and had fewer cracks than the structure of the $x=0.0$ material, while materials with $x=0.25$ and $x=0.5$ became progressively less ordered with second phase grains interrupting the layer structure. The magnetic susceptibility of the materials (chi) was measured as a function of temperature by means of a Faraday balance, and the ac magnetization was measured at temperature of 77 K. as a function of magnetic field using a PARC vibrating sample magnetometer. The latter measurement yielded a hysteresis loop with a width of delta M at a field of 2 kOe, while the maximum magnetization, observed at a field of $H_{c1}$, was designated $M_{max}$. The results, shown in Table 1, indicate that the magnetic properties are maximized for values of x around 0.1, more specifically between 0.0 and 0.25. This furnishes an indication of a similar trend in the case of the critical current.

EXAMPLE 5-17

Materials were prepared using a method similar to the one detailed in Example 1, with the following differences. Materials containing Y, Ba and Cu alone were prepared at atomic proportions of $(1+x)$, 2 and 3 respectively, with values of x of $-0.1$, 0.0 and 0.1. Other materials contained Y, Ba and Cu as well as a rare earth or niobium additive, designated A, at atomic proportions of 1, 0.1, 2, 3 for Y, A, Ba and Cu, respectively. Alumina supports coated with a pre-fired mixture of Y, Ba and Cu oxides were used instead of platinum supports in the heat treatment of the quenched materials. This heat treatment was carried out by placing the materials in a furnace pre-heated to 1100° C., holding them at this temperature for 1 hour, and then cooling them at a rate of 6° C./min to 1030° C., at 10° C./hr to 930° C., at 60° C./hr to 620° C., at 10° C./hr to 450° C. and at 60° C./hr to room temperature.

Scanning electron microscopy again showed the materials with $x=0.1$ for yttrium or $x=0.0$ for yttrium with an additive present to have a well-aligned grain structure with cracks and inter-grain voids largely eliminated. The magnetic properties of these materials, summarized in Table 2, show that the presence of excess yttrium or an additive causes an increase in total magnetization as well as in the fraction of the magnetization retained in high fields. When a Tb additive was used, spectral examination of the resulting product showed that some grains of 123 were substantially depleted in Y and substantially enriched in Tb, while the grains of 123 which were substantially enriched with Y, contained substantially no Tb. The 211 grains did not show any Tb content in spectral examination. This again implies an improvement in the critical current values of materials containing such additives or a modest amount of excess yttrium when the process described here is used.

EXAMPLES 18-21

This example illustrates the use of the partial-melting technique with excess yttrium. Materials were prepared with only Y, Ba, and Cu oxides, using similar mixing and calcination steps to those detailed in example 1. Values of x, were 0.0, 0.25, 0.5 and 1.0. The calcined powders were deep back in the case of $x=0.0$, and acquired a progressively stronger green tint as x gradually increased to 1.0. The powders were cold-pressed at about 2 kpsi into pellets were placed on an alumina substrate coated with a mixture of Y, Ba and Cu oxides, and first heated up to about 950° at an average rate of 30° C./hr, held at 950° for about 5 hours, heated to about 1050° C., and held at that temperature for about 5 minutes. The specimens were cooled down first from 1050° C. to 980° at a rate of 1° C./hr, followed by an average cooling rate of about 10° C./hr to room temperature. The dc magnetic susceptibility and magnetization results as a function of x are given in table 3. The results, shown in table 3, indicate that the magnetic properties are overall slightly lower than the values obtained in example 1 by the melt quenching technique, but the addition of excess yttrium, i.e. using formulations with $x>0$, again results in significant improvements. In this case higher values of x are necessary to produce the best properties (see table 3), while examples 1 and 2 show that the melt-quenching method makes it possible to obtain optimum properties at lower, but still positive, values of x.

TABLE 1

Magnetic Properties of Melt Quenched Materials
Effects of Composition Variations

| Composition $Y_xBa_2Cu_3O_z$ | x | $T_c$ K | Chi emu/g × 1000 at 77K | ΔM emu/g at 77K | $M_{max}$ emu/g at 77K | ΔM/Mmax at 77K | $H_{c1}$* Oe 77K |
|---|---|---|---|---|---|---|---|
| Ex. 1 | 1.0 | 91.9 | −9.7 | 1.4 | 2.8 | 0.49 | 129 |
| Ex. 2 | 1.1 | 91.2 | −12.9 | 2.4 | 4.2 | 0.57 | 205 |
| Ex. 3 | 1.25 | 91.4 | −10.6 | 1.0 | 2.5 | 0.39 | 128 |
| Ex. 4 | 1.5 | 90.2 | −9.5 | 1.1 | 2.7 | 0.41 | 139 |

TABLE 2

Magnetic Properties of Melt-Quenched Materials
Effects of Composition Variations

| Composition $Y_xA_yBa_2Cu_3O_z$ | X | A | Y | $T_c$ K | X emu/g × 1000 at 77K | ΔM emu/g at 77K | Mmax emu/g at 77K | M/Mmax | $H_{c1}$* Oe at 77K |
|---|---|---|---|---|---|---|---|---|---|
| Ex. 5 | 0.9 | | 0.0 | 88.7 | −3.2 | 1.2 | 1.6 | 0.75 | 80 |
| Ex. 6 | 1.0 | | 0.0 | 91.9 | −9.7 | 1.4 | 2.8 | 0.49 | 129 |
| Ex. 7 | 1.0 | | 0.0 | 88.1 | −5.6 | 1.5 | 2.9 | 0.52 | 151 |
| Ex. 8 | 1.0 | | 0.0 | 89.7 | −9.0 | 1.7 | 2.4 | 0.71 | 145 |
| Ex. 9 | 1.1 | | 0.0 | 91.2 | −12.9 | 2.4 | 4.2 | 0.57 | 205 |
| Ex. 10 | 1.1 | | 0.0 | 89.6 | −5.9 | 5.4 | 3.9 | 1.38 | 185 |
| Ex. 11 | 1.0 | Gd | 0.1 | 89.3 | −8.9 | 2.2 | 3.4 | 0.65 | 130 |
| Ex. 12 | 1.0 | Tb | 0.1 | 89.3 | −13.2 | 3.6 | 5.3 | 0.68 | 196 |
| Ex. 13 | 1.0 | Tb | 0.1 | 90.5 | −14.3 | 2.2 | 3.0 | 0.73 | 108 |
| Ex. 14 | 1.0 | Ho | 0.1 | 88.4 | −10.1 | 3.5 | 4.8 | 0.73 | 166 |
| Ex. 15 | 1.0 | Yb | 0.1 | 88.1 | N.A. | 2.4 | 2.7 | 0.89 | 101 |
| Ex. 16 | 1.0 | Nb | 0.1 | 91.5 | N.A. | 4.5 | 6.0 | 0.75 | 246 |
| Ex. 17 | 1.0 | Nb | 0.1 | 90.0 | 11.7 | 4.8 | 5.1 | 0.94 | 105 |

N.A. = Not available

TABLE 3

| Composition $Y_{(1+x)}Ba_2Cu_3O_z$ | X | $T_c$ K | X emu/g × 1000 | M emu/g 77K | $M_{max}$ emu/g 77K | M/$M_{max}$ at 77K |
|---|---|---|---|---|---|---|
| Ex. 18 | 0 | 91 | −5.1 | 0.45 | 1.1 | 0.41 |
| Ex. 19 | 0.25 | 91 | −5.2 | 0.42 | 1.4 | 0.30 |
| Ex. 20 | 0.5 | 91 | −6.5 | 0.65 | 1.6 | 0.41 |
| Ex. 21 | 1.0 | 90 | −8.1 | 0.95 | 2.3 | 0.4 |

What is claimed is:

1. A process of preparing superconducting materials which comprises the following steps:
   (a) preparing a mixture powder comprising oxides, oxide precursors, or a combination thereof, said mixed powder being of the overall composition $M_1A_yB_tCu_3O_z$, where M is one or more elements selected from Y, La, Ce, Pr, Nd, Pm, Sm, Eu, Gd, Tb, Dy, Ho, Er, Tm, Yb, Lu; A is one or more elements selected from Sc, y, La, Ce, Pr, Nd, Pm, Sm, Eu, Gd, Tb, Dy, Ho, Er, Tm, Yb, Lu, V, Nb, Ta, Al, Ga, In, Tl, Bi and Mo; B is one or more elements selected from Ba, and Sr; y has a value between about 0.001 and about 1.0, z has a value substantially higher than 6 but lower than 7, and t has a value between about 1.8 and about 2.2;
   (b) heating the mixture in a first heating step to a temperature above 1200° C.;
   (c) soaking at the peak heating temperature from zero time to 24 hours;
   (d) rapidly cooling the mixture to a first cooling step to a temperature below 900° C.;
   (e) re-heating the mixture in a second heating step to a temperature between 1000° C. and 1350° C.;
   (f) cooling the mixture in a second cooling step under an oxygen-containing atmosphere at a rate of about 0.5° C./hr to about 300° C./hr.

2. A process according to claim 1 wherein M is yttrium, A is one or more elements selected from Sc, Y, La, Ce, Pr, Nd, Pm, Sm, Eu, Gd, Tb, Dy, Ho, Er, Tm, Yb, Lu, Nb, Ta and In; B is barium; y has a value between about 0.01 and about 0.5, and t has a value between about 1.95 and about 2.05.

3. A process according to claim 1 where y has a value between 0.01 to 0.5 and t has a value between about 1.95 to 2.05.

4. A process according to claim 3 wherein y is about 0.01 to about 0.1 and t is about 2.0.

5. A process according to claim 1 wherein rapid cooling after the heating above 1200° C. is carried out in a suitable mold to produce an article.

6. A process according to claim 1, wherein the first heating step takes place at a temperature in the range between about 1350° to about 1600° C.

7. A process according to claim 6, wherein the first heating step takes place at a temperature in the range between about 1400° C. to about 1500° C.

8. A process according to claim 1, wherein the second heating step takes place at a temperature in the range between about 1050° to about 1300° C.

9. A process according to claim 8 wherein the second heating step takes place at a temperature between about 1100° C. to about 1250° C.

10. A process according to claim 1, wherein the first cooling step takes place using forced air cooling.

11. A process according to claim 1, wherein the first cooling step comprises rapidly cooling the mixture to below about 700° C.

12. A process according to claim 11, wherein the first cooling step comprises rapidly cooling the mixture to a temperature below 300° C.

13. A process according to claim 1, wherein the second cooling step takes place at a cooling rate between 1° C./hr and about 60° C./hr.

14. A process according to claim 13 wherein said second cooling step takes place at a cooling rate between 1° C./hr to about 30° C./hr.

* * * * *

UNITED STATES PATENT AND TRADEMARK OFFICE
CERTIFICATE OF CORRECTION

PATENT NO. : 5,270,292   Page 1 of 4
DATED : December 14, 1993
INVENTOR(S) : Hojaji et al It is certified that error appears in the above-indentified patent and that said Letters Patent is hereby corrected as shown below:

ON THE TITLE PAGE:

"[54] METHOD FOR THE FORMATION OF HIGH TEMPERATURE SEMICONDUCTORS" to

--[54] METHOD FOR THE FORMATION OF HIGH TEMPERATURE SUPERCONDUCTORS--.

Column 1, line 2, change "Semiconductors" to --Superconductors--;

Column 1, line 25, change "effects" to --effect--;

Column 1, line 38, change "Tc" to --$T_c$--;

Column 1, line 41, change "semiconductors" to --superconductors--;

Column 1, line 47, change "superconductor" to --superconductors--.

Column 2, line 5, change "inventer" to --invention--;

Column 2, line 11, change "Yttrium" to --yttrium--;

Column 2, line 11, change "x:2:3" to --1:2:3--;

UNITED STATES PATENT AND TRADEMARK OFFICE
CERTIFICATE OF CORRECTION

PATENT NO. : 5,270,292
DATED : December 14, 1993
INVENTOR(S) : Hojaji et al

It is certified that error appears in the above-indentified patent and that said Letters Patent is hereby corrected as shown below:

Column 2, line 19, change "imposed" to --improved--;

Column 2, lines 65-66, change "compounds" to --elements--.

Column 3, line 6, change "0.1" to --1.0--;

Column 3, line 9, change "Z" to --z--;

Column 3, line 33, change "Preferable" to --Preferably--.

Column 4, line 30, change ";" to --,--.

Column 5, line 2, change "of" to --in--;

Column 5, line 6, following "order" insert --to--;

Column 5, line 11, change "were" to --was--;

Column 5, line 20, change "BaCo3" to --$BaCO_3$--;

Column 5, line 20, delete "powders";

Column 5, line 26, following "C", delete --.--;

Column 5, line 30, following "C", delete --.--.

UNITED STATES PATENT AND TRADEMARK OFFICE
CERTIFICATE OF CORRECTION

PATENT NO. : 5,270,292

DATED : December 14, 1993

INVENTOR(S) : Hojaji et al

Page 3 of 4

It is certified that error appears in the above-indentified patent and that said Letters Patent is hereby corrected as shown below:

Column 6, line 43, following "x" delete --,--;

Column 6, line 44, change "back" to --black--;

Column 6, line 47, following "pellets" insert --which--;

Column 6, line 56, following "and" insert --dc--.

Columns 7-8, Table 2, second heading, change "X" to --x--.

Column 7, Table 3, line 31, change "M" in middle heading to --$\Delta M$--;

Column 7, Table 3, line 32, change "$M/M_{max}$" in last heading to --$\Delta M/M_{max}$--;

Column 7, Table 3, line 33, change "$Y_{(1+x)}Ba_2Cu_3O_z$" to --$Y_{(1+x)}Ba_2Cu_3O_z$--;

UNITED STATES PATENT AND TRADEMARK OFFICE
CERTIFICATE OF CORRECTION

PATENT NO.   : 5,270,292
DATED        : December 14, 1993
INVENTOR(S)  : Hojaji et al It is certified that error appears in the above-indentified patent and that said Letters Patent is hereby corrected as shown below:

Column 7, Table 3, line 33, change "X" in second heading to --x--;

Column 7, line 42, change "mixture" to --mixed--;

Column 7, line 48, change "y" to --Y--.

Signed and Sealed this

Seventeenth Day of October, 1995

Attest:

Attesting Officer

BRUCE LEHMAN

Commissioner of Patents and Trademarks